United States Patent [19]

Nicholas

[11] Patent Number: 4,546,534
[45] Date of Patent: Oct. 15, 1985

[54] SEMICONDUCTOR DEVICE MANUFACTURE

[75] Inventor: Keith H. Nicholas, Reigate, England

[73] Assignee: U.S. Philips Corporation, New York, N.Y.

[21] Appl. No.: 461,328

[22] Filed: Jan. 27, 1983

[30] Foreign Application Priority Data

Mar. 17, 1982 [GB] United Kingdom ................ 8207712

[51] Int. Cl.⁴ .................. H01L 21/265; H01L 21/312
[52] U.S. Cl. .................... 29/571; 29/576 B; 29/576 W; 29/578; 148/187
[58] Field of Search ................ 29/571, 578, 576 B, 29/576 W; 148/187

[56] References Cited

U.S. PATENT DOCUMENTS

| 3,388,000 | 6/1968 | Waters et al. ............ 29/578 |
| 3,920,483 | 11/1975 | Johnson et al. ........... 148/1.5 |
| 4,231,811 | 11/1980 | Somekh et al. ........... 148/1.5 |
| 4,253,888 | 3/1981 | Kikuchi ................. 148/187 |
| 4,394,181 | 7/1983 | Nicholas .............. 29/571 X |
| 4,398,964 | 8/1983 | Malwah ................ 148/1.5 |
| 4,420,872 | 12/1983 | de Zaldivar ............ 29/578 X |

Primary Examiner—George T. Ozaki
Attorney, Agent, or Firm—Paul R. Miller

[57] ABSTRACT

A first masking layer on a semiconductor body is defined by exposing a layer of negative acting radiation sensitive resist to a radiation pattern through a mask. Doped regions are then formed at unmasked surface areas of the body. A layer of positive acting resist is provided on an insulating layer at the surface of the body, and a second masking layer is defined in this layer by exposure to the pattern radiation beam through the same mask. An insulating layer pattern which is accurately aligned above the doping region is then formed by etching the exposed parts of the layer. Alternatively, the same type of resist is used at both exposure stages. By adjusting the resist processing, the second masking layer is made larger than the first masking layer. In this case, the second masking layer is used to define an oxygen mask before oxidizing the exposed surface of the body to form an accurately aligned oxide layer pattern.

30 Claims, 25 Drawing Figures

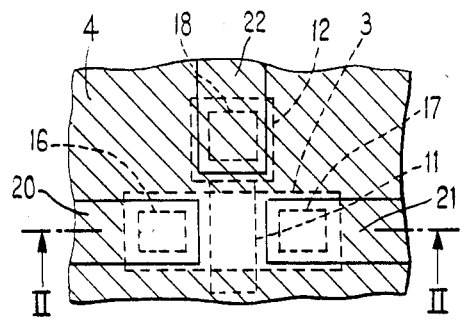
Fig. 1
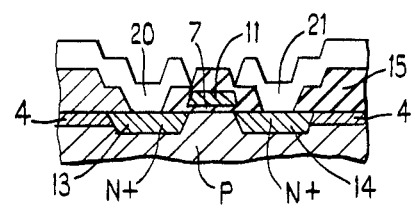
Fig. 2
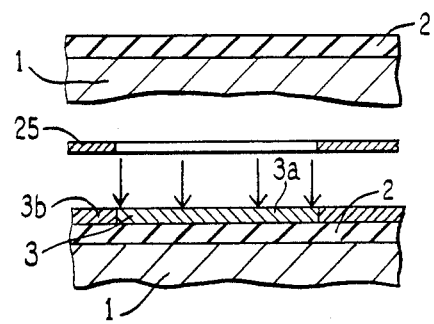
Fig. 3
Fig. 4
Fig. 5
Fig. 6

SEMICONDUCTOR DEVICE MANUFACTURE

This invention relates to a method of manufacturing a semiconductor device having an insulating layer pattern on a doped surface region of a semiconductor body, and further relates to a semiconductor device manufactured by such a method.

It is often a requirement in a semiconductor industry that a doped surface region of a semiconductor body is accurately aligned with an overlying insulating layer pattern. The manufacture of IGFETs (which is an acronym for insulated gate field effect transistors) is an example of this requirement. In this case the doped region is a parasitic channel stopper and the insulating layer pattern is a thick field oxide.

It is well-known in the art that when a plurality of IGFETs is provided in a semiconductor body spontaneous inversion layers tend to form between active devices. This can result in an undesirable parasitic effect between adjacent transistors. The provision of channel stoppers and field oxides overcomes this problem by raising the parasitic threshold voltage, which is the minimum voltage at which conduction between adjacent transistors occurs.

U.K. patent specification GB No. 2,024,504 is concerned particularly with the accurate alignment of the channel stopper and the field oxide in the manufacture of IGFETs. In that patent specification it is acknowledged that a known method of forming a field oxide on a channel stopper involves the provision of a first layer of photoresist on an oxide layer at a major surface of a semiconductor body. The resist layer is then exposed to a patterned radiation beam from a first photomask to define a first masking layer in the resist. Subsequently an ion implantation is carried out to form doped channel stopper regions at surface areas of the body not masked by the first masking layer. Next, a second photoresist layer is provided on an oxide layer which will eventually form the field oxide. The second photoresist layer is exposed to a patterned radiation beam from a second photomask to define a second masking layer in the second layer of photoresist. Parts of the oxide layer not masked by the second masking layer are then removed by etching to leave portions of the oxide as an oxide layer pattern above the channel stoppers.

Unfortunately, the accuracy with which the field oxide and the channel stopper can be aligned using this method is somewhat restricted by the inevitable lack of precision involved in the difficult step of registering two different photomasks. However, even if more precise photomask registration were possible, alignment inaccuracies would still result from errors introduced in making two separate photomasks.

Having recognized this problem of alignment accuracy the industry has largely abandoned the technique employing two photomasks in favour of methods which avoid two exposure stages. For example in U.K. patent specification GB No. 2,024,504 mentioned above a method is disclosed in which a first masking layer is defined photolithographically in negative photoresist. Channel stoppers are then formed by implanting ions into surface regions of the underlying semiconductor body not masked by the first masking layer after which a second masking material is provided over the whole of the upper surface. A second masking layer is then defined (using the so-called lift-off technique) by removing the remaining portion of photoresist and the part of the second masking material present thereon. The second masking layer is used to protect the underlying parts of an oxide layer during an etching treatment to remove the exposed parts of the same oxide layer. In this way the remaining parts of the oxide layer form the thick field oxide and are accurately aligned with the underlying channel stoppers.

While this method is capable of providing a high degree of alignment accuracy its attractiveness may be marred because, rather than relying on conventional processing steps, it involves the somewhat unconventional technique of negative resist lift-off.

Another method of aligning the field oxide with the channel stopper is disclosed in U.K. Patent Specification No. 1,348,391. In this case a layer of masking material capable of masking against oxidation is provided on a semiconductor body. Using photolithography a masking layer is defined in the material at areas of the body where the source and drain zones and the channel region of an IGFET are to be formed. The field oxide is then formed by oxidizing areas of the semiconductor body not masked by the masking layer, the oxide thus formed being inset, at least over part of its thickness, in the body. The same masking layer is also used as a mask during the introduction of a dopant into the semiconductor body to form channel stoppers below the field oxide.

Again, this method enables alignment of the channel stopper and the field oxide using only a single photomask. However, in this case the alignment accuracy is adversely affected by sideways diffusion of the doped regions during subsequent processing steps thus causing, for example, an undesirable overlap of the channel region and the channel stoppers along the length of the channel region.

According to the present invention a method of manufacturing a semiconductor device having an insulating layer pattern on a doped surface region of a semiconductor body, including the steps of providing a first layer of radiation sensitive resist on an insulating layer at a major surface of the semiconductor body, exposing the first resist layer to a patterned radiation beam from a mask to define a first masking layer in the resist, forming a doped region in the semiconductor body at surface areas not masked by the first masking layer, providing a second layer of radiation sensitive resist on the insulating layer, separately exposing the second resist layer to a patterned radiation beam from a mask to define a second masking layer in the second resist layer, and removing parts of the insulating layer not masked by the second masking layer to leave a portion of the insulating layer for forming the insulating layer pattern, is characterized in that the same mask is used at the two separate steps of exposing the first and the second resist layers.

A method in accordance with the invention involves two separate exposure steps with the same mask being used for both exposures. This has the advantage that the insulating layer pattern can be aligned with the underlying doped region to a high degree of accuracy. Moreover, no unusual processing techniques are required because all the steps of the method are quite conventional in their own right.

In one example of a method in accordance with the invention one of the resist layers is positive acting and the other resist layer is negative acting so that complementary patterns are defined at the two exposure stages. In this case the remaining portion of the insulating layer itself forms the insulating layer pattern.

In another example the resist layers are both negative or both positive acting and at one of the exposure stages the resist processing is adjusted so that the first masking layer is larger than the second masking layer. In this case the insulating layer pattern is formed by oxidizing areas of the semiconductor body not masked by the remaining portion of the insulating layer (which, typically, is silicon nitride). The oxide layer pattern thus formed, at least one part of its thickness, is inset in the semiconductor body.

This method retains the benefit of using only a single radiation mask but, in contrast with the known method of aligning a doped region with an inset insulating layer pattern mentioned above, the present method has the advantage that any overlap between the channel stopper and the channel region can be avoided by adjusting the resist processing.

Embodiments of the invention will now be described, by way of example, with reference to the accompanying drawings, in which:

FIG. 1 is a plan view of an IGFET forming part of a large scale silicon integrated circuit comprising a plurality of similar transistors;

FIG. 2 is a sectional view of the IGFET taken on the line II—II of FIG. 1;

FIGS. 3 to 14 are sectional views of the IGFET taken along the line II—II of FIG. 1 at various stages of a first method in accordance with the invention;

Figure 7:
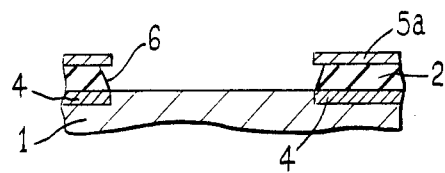
Figure 8:
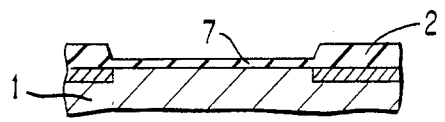

It is noted that, for the sake of clarity, the Figures are not drawn to scale.

FIG. 1 is a plan view of a single IGFET which may form part of an integrated circuit. A doped region 4 (hatched in FIG. 1) outside the active area of the device forms the channel stopper. FIG. 2 is a cross-sectional view of a body portion of the IGFET taken along the line II—II of FIG. 1. A thick insulating layer pattern in the form of a thick field oxide layer 15 is situated above the channel stopper 4. A metallization pattern 20 and 21 contacts the source 13 and drain 14 of the device via apertures 16 and 17 in the oxide layer 15. A polycrystalline silicon layer 11 and 12 forms the gate 11 of the device, which is insulated from the semiconductor body by a thin oxide layer 7. The thin oxide layer 7 is generally known in the art as the gate oxide. A window 18 exposes the region 12 of the polycrystalline silicon layer via which window the gate 11 is contacted by the metallization 22.

The manufacture of the integrated circuit so far as is relevant to this IGFET will now be described with reference to FIGS. 3 to 15.

The starting material is a p-type semiconductor body 1, for example a silicon body, with a thickness of approximately 250 micrometers and a resistivity of, for example, 4 ohm·cm. The major surfaces of the semiconductor body are orientated in the (100) direction. On one such major surface an insulating layer 2, for example a layer of silicon oxide having a thickness of approximately 0.5 micrometer, is formed by subjecting the body to an oxidation treatment for 80 minutes at 1,000° C. in wet oxygen obtained by bubbling the gas through a water bath at 95° C. (See FIG. 3).

A layer 3 of negative acting radiation sensitive resist is deposited on the oxide layer and is exposed to a patterned radiation beam (shown as arrows in FIG. 4) from a mask 25. The lithographic technique used at this stage may be conventional photolithography in which case the resist layer 3 would be a photoresist and the mask 25 would be a photomask. Alternatively, techniques such as X-ray lithography or electron-beam lithography may be used. In the case of electron-beam lithography the patterned radiation beam is a patterned beam of electrons and the mask 25 typically comprises a photocathode on a substrate having areas which are transparent and areas which are opaque to ultra-violet light (UV). By flooding the reverse side of the mask with UV the photocathode emits a patterned electron beam corresponding to the transparent areas of the mask. This technique, which has come to be known as electron image projection, is itself well documented and for more information reference is invited, for example, to the paper by J. P. Scott entitled "1:1 Electron Image Projector" on paes 43 to 47 of Solid State Technology, May 1977. If electron-beam lithography is used the resist layer 3 is a negative acting electron sensitive resist layer such as polystyrene which is deposited in known manner.

A part 3a of the resist layer 3 corresponding to the transparent parts of the mask 25 is directly exposed to the patterned radiation beam. Being a negative acting resist the unexposed portions 3b are removed by developing to leave the exposed part 3a as a first masking layer which is situated above the area of the semiconductor body where the source and drain zones and the channel region of the IGFET are to be formed (see FIG. 5). The first masking layer 3a masks areas of the substrate surface during a subsequent doping treatment to form the doped region 4 in the semiconductor body. The doped region 4 constitutes the channel stopper and the doping treatment may be effected by implanting a dose of $1.5 \times 10^{12}$ boron ions/cm$^2$ at an energy of 180 keV through the oxide layer 2. After this implant the first masking layer 3a is removed by etching in fuming nitric acid and/or an oxygen plasma.

The next step in the processing is the deposition of a positive acting radiation sensitive resist layer 5 (see FIG. 6). A suitable positive resist for electron lithography is polymethylmethacrylate (PMMA) which is provided in known manner. The resist layer 5 is exposed to a patterned radiation beam from the same mask 25 that was used in the previous exposure and which is registered using known techniques. Particularly accurate registration is possible using the electron image projector by detecting the X-ray signal generated from an alignment marker pattern specially provided for this purpose on the semiconductor substrate. This registration technique is well known in its own right. For more details reference may be made to the above-mentioned paper by J. P. Scott.

A part 5b of the positive resist layer 5 corresponding to the transparent parts of the mask 25 is directly exposed to the patterned radiation beam. Being a positive acting resist the exposed portion 5b is removed by developing to leave the unexposed portion 5a as a second masking layer which is now used as an etchant mask while removing the exposed parts of the oxide layer 2 to leave an oxide layer pattern which forms the so-called field oxide and which is accurately aligned above the channel stopper 4 (see FIG. 7).

It is noted here that by adjusting the processing (i.e. the exposure or the development) of either of the resist layers 3,5 the alignment of the field oxide and the channel stopper can be controllably altered, should this be necessary for any reason. This technique of adjusting the resist processing is described in more detail below.

After removing the remaining portion 5a of the positive resist by etching in fuming nitric acid the device is subjected to a dry oxidation treatment at 1,000° C. for 35 minutes to form an oxide layer 7 approximately 500 Å thick. This oxide layer 7 is a thin oxide layer which is generally known in the art as the gate oxide. During this oxidation treatment the thickness of the field oxide 2 is increased by a small amount. The entire upper surface of the p-type silicon body 1 is thus covered by a silicon oxide insulating layer having a thicker portion 2 and a thinner portion 7 (see FIG. 8).

The threshold voltage of the active device can be determined by a further ion implantation at this stage. In one specific example of an n-channel IGFET a dose of $4 \times 10^{11}$ boron ions/cm² is implanted at an energy of 40 keV.

Figure 9:
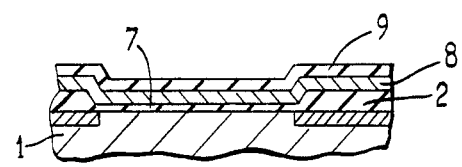

An undoped polycrystalline silicon layer 8 approximately 0.3 micrometer thick is then deposited over the surface of the field oxide 2 and the gate oxide 7 as shown in FIG. 9 after which a phosphorus diffusion step is carried out to render the polycrystalline silicon layer 8 more highly conductive. The phosphorus doped polycrystalline silicon layer may have a sheet resistance of 50 ohms per square.

An oxide layer 9 approximately 500 Å thick is then formed on the surface of the polycrystalline silicon layer by oxidation for 35 minutes in dry oxygen at 1,000° C. (See FIG. 9).

Figure 10:
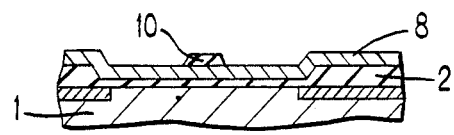
Figure 11:
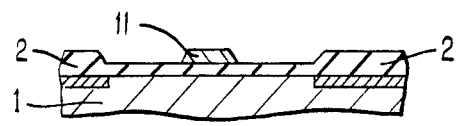

Using conventional lithographic and etching techniques a masking portion 10 of the oxide layer is defined on the polycrystalline silicon layer 8 at the area where the gate electrode of the IGFET is to be formed as shown in FIG. 10. The portion 10 of the oxide layer masks the surface of the polycrystalline layer 8 during a subsequent etching step to form the gate electrode 11 from the polycrystalline silicon layer 8 as shown in FIG. 11.

Figure 12:
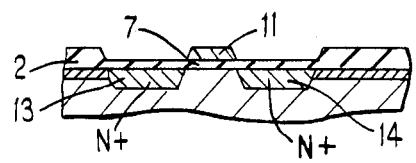

The next step in the processing is the implantation of phosphorus ions to form the source and drain regions 13 and 14 (see FIG. 12). This phosphorus implantation is effected simultaneously through the exposed portions of the thinner oxide layer 7. A dose of $4 \times 10^{15}$ phosphorus ions/cm² is used at an energy of 80 keV. The source and drain regions 13 and 14 may overdope a small region of the channel stoppers 4. The much higher concentration of doping ions in the source and drain regions cancels out the effect of the channel stopper dopant at the area of such overdoping.

Figure 13:
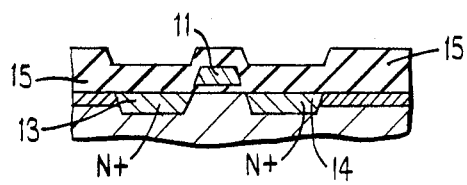
Figure 14:
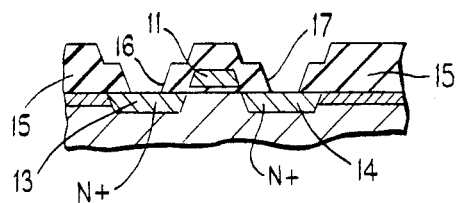

FIG. 13 shows the next stage of the processing. First, an oxidation treatment is carried out at 850° C. for 20 minutes in wet oxygen saturated at 95° C. to form an oxide layer approximately 500 Å thick. A further oxide layer 0.5 micrometer thick is then deposited to yield the oxide layer 15 as shown in FIG. 13.

Contact windows 16 and 17 are defined in the oxide layer 15 by a conventional lithographic and etching treatment (see FIG. 14) and a contact window 18 is also opened so that the polycrystalline silicon gate 11 can be contacted (see FIG. 1). A layer of aluminium approximately 1 micrometer thick is then evaporated over the device to contact the exposed source and drain regions 13 and 14 and the gate 11. The aluminium layer may comprise 1% silicon by weight. A further conventional lithographic and etching treatment is used to define the metallic interconnection pattern 20, 21 and 22 as shown in FIG. 1. The interconnections 20, 21 and 22 overlie the thick oxide layer 15 and may connect the IGFET shown in FIGS. 1 and 2 with other similar devices constituting an integrated circuit.

A modification of the above method will now be described with reference to FIGS. 15 to 18. In this case the order of the two exposure steps to form the first and second masking layers 3a, 5a respectively is reversed.

Figure 15:
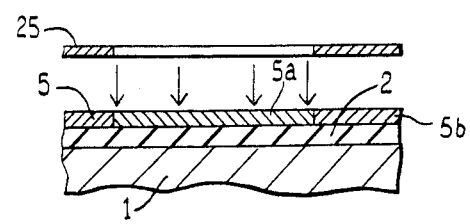
FIGS. 15 to 18 are sectional views of the IGFET of FIGS. 1 and 2 illustrating a modification of the first method.
Figure 16:
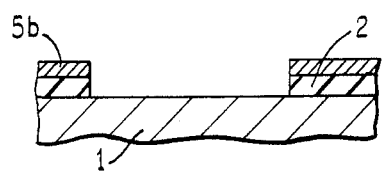

As shown in FIG. 15 a layer of positive radiation sensitive resist 5 is deposited on the oxide layer 2. The part 5a of the resist layer is exposed to the patterned radiation beam from a mask 25. Being a positive resist the parts 5a are removed by developing (see FIG. 16). The remaining portion 5b of the resist acts as a masking layer during a subsequent etching step to remove the exposed part of the oxide layer 2, thus leaving an oxide layer pattern below the masking layer.

Figure 17:
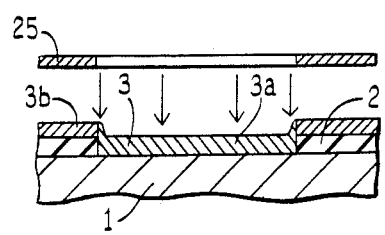
Figure 18:
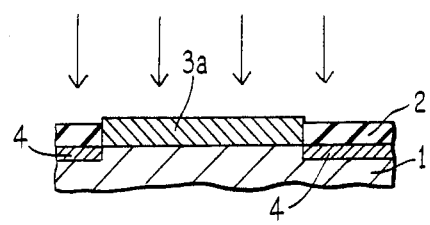

After removing the remaining parts 5b of the positive resist a layer 3 of negative acting radiation sensitive resist is deposited on the oxide layer pattern 2 and on the exposed parts of the semiconductor body 1 as shown in FIG. 17. The parts 3a of resist layer 3 are then exposed to a patterned radiation beam from the mask 25 and the unexposed parts 3b are removed by developing. The remaining part 3a of the negative resist then acts as a masking layer during a subsequent implantation of ions through the field oxide 2 to form the channel stopper regions 4 which are thus accurately aligned with the field oxide 2 (see FIG. 18).

After removing the masking layer portion 3a the method may be continued as described above with reference to FIGS. 8 to 14.

A different method of manufacturing an IGFET will now be described with reference to FIGS. 19 to 23.

The starting material is a p-type silicon body 100 having a resistivity of approximately 3 ohm·cm. The major surfaces of the body 100 are oriented in the (100) direction. On one such major surface is grown a layer 101 of oxide approximately 50 nm thick and a layer 102 of silicon nitride having a thickness of approximately 100 nm is deposited on the oxide layer 101 in the usual manner. A layer 103 of negative acting electron sensitive resist, for example polystyrene, is then deposited on nitride layer 102 and part 103a of the resist is directly exposed to a patterned electron beam from a photocathode mask 125. By over-exposing the resist a part 103c of the layer 103 surrounding the directly exposed part 103a is exposed by scattered electrons from the patterned electron beam (see FIG. 19). The resist layer 103 is then under-developed to remove only the unexposed parts 103b, the remaining parts 103a and 103c forming a first masking layer. A dose of $2 \times 10^{13}$ boron ions/cm² is then implanted with an energy of 60 keV into surface areas of the semiconductor body not masked by the masking layer 103a, 103 c through the nitride and oxide layers 101, 102 respectively to form a channel stopper 104 (see FIG. 20).

Figure 21:
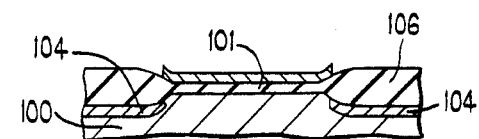
Figure 22:
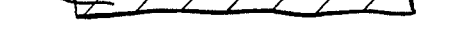

After removal of the first masking layer 103a, 103c a further negative acting electron sensitive resist such as polystyrene is deposited in known manner on the nitride layer 102 (see FIG. 21). The part 105a of the negative resist layer 105 is then directly exposed to a patterned electron beam from the same photocathode mask 125, registration of this mask being carried out in the usual manner.

By under-exposing the resist layer 105 experiences the minimum exposure due to scattered electron radiation so that by over-developing only a portion 105a remains which corresponds substantially exactly with the transparent area of mask 125. The remaining portion 105a of the positive resist layer forms a second masking layer which is smaller than the first masking layer 103a, 103c. Careful control of the resist processing thus enables the relative dimensions of the tow masking layers to be varied as desired. The second masking layer 105a is used to mask the underlying insulating layers 101, 102 during a conventional etching treatment to remove the exposed parts of these layers. The remaining part of the silicon nitride layer 102 is then used as an oxidation mask then the exposed parts of the silicon body are oxidized to form an oxide layer pattern 106 which is inset, at least over part of its thickness, in the silicon body 100 and which is aligned above the channel stopper 104 (see FIG. 22). During the oxidation step the channel stopper 104 tends to diffuse sidewards, but because it can be arranged for the oxidation mask 102 to be smaller than the channel stopper implant mask 103a, 103c as explained above the channel stopper, in its final form, can be spaced apart from the active parts of the IGFET.

Figure 23:
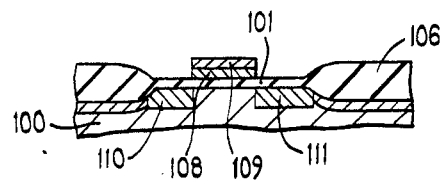

After removal of the remaining portion of the nitride layer 102 a polysilicon layer is deposited on the oxide layer pattern 106 and on the remaining part of the oxide layer 101. In conventional manner phosphorus is diffused into the polysilicon before forming an oxide layer on the polysilicon. A mask 109 formed from this oxide is used to define in the polysilicon layer a gate electrode 108 as shown in FIG. 23. Phosphorus ions are then implanted into the semiconductor body using a dose of $2 \times 10^{15}$ ions/cm$^2$ at an energy of 100 keV. The gate 108 and the inset oxide layer pattern 106 mask against the implanted ions. Thus, at the exposed areas n-type source and drain regions 110 and 111 respectively are formed (see FIG. 23). The IGFET can be completed using techniques well known to those skilled in the art by depositing an insulating layer, forming contact windows therein, and defining the metallization to contact the gate and the source and drain regions.

In a modified form of this method the order of the two exposure steps to define the two masking layers may be reversed as described in more detail below.

Figure 19:
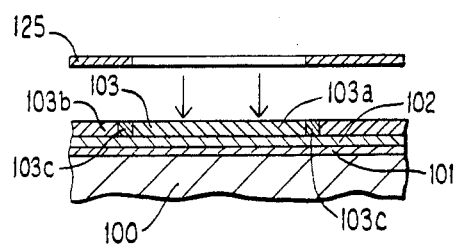
FIGS. 19 to 23 are sectional views of a similar IGFET at various stages of a further method in accordance with the invention.
Figure 20:
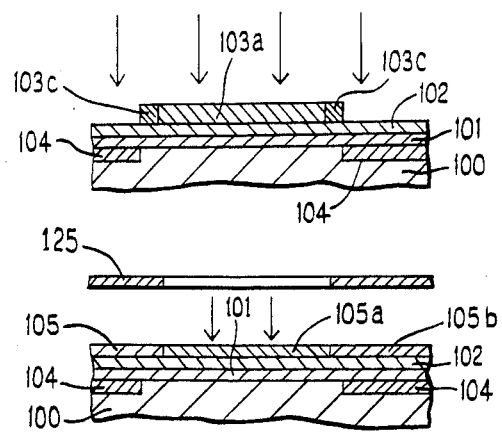
Figure 24:
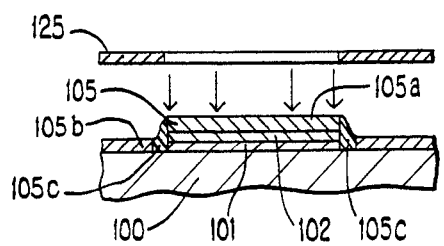
FIGS. 24 and 25 are sectional views of an IGFET illustrating a modification of the further method.
Figure 25:
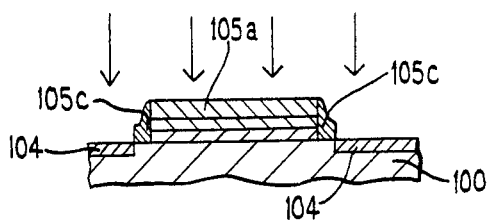

As shown in FIG. 19 a layer 103 of negative radiation sensitive resist is provided on a silicon nitride layer and is exposed to a patterned radiation beam from the photocathode mask 125. At this stage, however, the resist is under-exposed and over-developed so as to leave portion 103a only. The parts of the insulating layers 101,102 which are not masked by the remaining portion 103a of the resist layer 103 are removed by etching. After removing portion 103a a second negative acting radiation sensitive resist layer 105 is deposited on the exposed surface of the silicon body and on the remaining part of the nitride layer 102 (see FIG. 24). The resist 105 is then exposed to a patterned radiation beam from the same mask 125. By over-exposing and under-developing the resist layer 105 the portions 105a and 105c are left encapsulating the remaining parts of the nitride and oxide layers 102,101 respectively and the portion 105b is removed. The channel stopper 104 is then formed by implanting ions into the surface areas of the semiconductor body not masked by the resist portions 105a, 105c (see FIG. 25). After removal of the remaining resist the silicon nitride is used as an oxidation mask in the formation of the inset oxide layer pattern 106 (cf. FIG. 22). The method then continues in the same way as described above.

Many modifications are possible within the scope of the present invention. Thus, for example, the same results can be achieved using resists of the opposite type to those described above in conjunction with a mask of the reverse type (that is to say the opaque parts of the mask are now transparent and vice versa). It is noted here that when the first and second resist layers are both positive acting the method differs from that described above with reference to FIGS. 19 to 23, or FIGS. 24 and 25, in that the larger first masking layer is formed by under-exposing and under-developing the first resist layer, and the smaller second masking layer is formed by over-exposing and over-developing the second resist layer. Thus the first masking layer is formed from the areas of the first resist layer which are not directly exposed and the second masking layer is formed from the unexposed area of the second resist layer.

Moreover, in addition to the manufacture of n-channel IGFETs, a method in accordance with the invention can be used to make other semiconductor devices in which an insulating layer pattern has to be provided on a doped surface region of a semiconductor body.

What I claim is:

1. A method of manufacturing a semiconductor device having an insulating layer pattern on a doped surface region of a semiconductor body, said method comprising the steps of
   providing a first radiation sensitive resist layer on at least one insulating layer on a major surface of a semiconductor body,
   exposing said first resist layer to a patterned radiation beam through a mask to define a first masking layer in said first resist layer,
   forming a doped region in said semiconductor body at surface areas free of said first masking layer,
   removing said first masking layer,
   providing a second radiation sensitive resist layer on said insulating layer,
   exposing said second resist layer to another patterned radiation beam through said same mask to define a second masking layer in said second resist layer, and
   removing parts of said insulating layer free of said second masking layer to provide an insulating layer pattern.

2. A method according to claim 1, wherein one of said first or second resist layers is positive acting and the other of said second or first resist layers is negative acting, and wherein remaining portions of said insulating layer form said insulating layer pattern.

3. A method according to claim 2, wherein one of said two masking layers is defined partly by an area of the corresponding resist layer exposed directly to the relevant patterned radiation beam and partly by surrounding areas of said corresponding resist layer exposed to scattered radiation from said patterned radiation beam.

4. A method according to claim 3, where said insulating layer is an oxide.

5. A method according to claim 2, where said insulating layer is an oxide.

6. A method according to claim 1, where one of said two masking layers is defined partly by an area of the corresponding resist layer exposed directly to the relevant patterned radiation beam and partly by surrounding areas of said corresponding resist layer exposed to scattered radiation from said patterned radiation beam.

7. A method according to claim 6, where said first and second resist layers are both negative acting or both positive acting, and wherein said insulating layer pattern is formed by oxidizing areas of said semiconductor body free of said insulating layer, said oxide layer pattern being inset into said semiconductor body at least over a part of the thickness of said oxide layer pattern.

8. A method according to claim 7, where said insulating layer is silicon nitride.

9. A method according to one of claims 1, 2, 3, 4, 5, 6, 7 or 8, wherein said parts of said insulating layer free of said second masking layer are removed by etching.

10. A method according to one of claims 1, 2, 3, 4, 5, 6, 7 or 8, wherein said doped region is formed by ion implantation.

11. A method according to claim 10, wherein said ions are implanted into said semiconductor body through said insulating layer.

12. A method according to one of claims 1, 2, 3, 4, 5, 6, 7 or 8, wherein a field effect transistor is formed in said semiconductor body.

13. A method according to claim 12, wherein said insulating layer pattern is an oxide forming a thick field oxide around said field effect transistor, and wherein said doped region forms a parasitic channel stopper to prevent inversion layers forming below areas of said thick field oxide.

14. A method according to claim 12, wherein said first and second resist layers are sensitive to electron radiation, and said patterned radiation beam is an electron beam.

15. A method according to one of claims 1, 2, 3, 4, 5, 6, 7 and 8, wherein said first and second resist layers are sensitive to electron radiation, and said patterned radiation beam is an electron beam.

16. A method of manufacturing a semiconductor device having an insulating layer pattern on a doped surface region of a semiconductor body, said method comprising the steps of providing a first radiation sensitive resist layer on at least one insulating layer on a major surface of a semiconductor body, exposing said first resist layer to a patterned radiation beam through a mask to define a first masking layer in said first resist layer, removing parts of said insulating layer free of said first masking layer to provide an insulating layer pattern, removing said first masking layer, providing a second radiation sensitive resist layer on said semiconductor body and said insulating layer pattern, exposing said second resist layer to another patterned radiation beam through said same mask to define a second masking layer in said second resist layer, and forming a doped region in said semiconductor body at surface areas free of said second masking layer.

17. A method according to claim 16, wherein one of said first or second resist layers is positive acting and the other of said second or first resist layers is negative acting, and wherein remaining portions of said insulating layer form said insulating layer pattern.

18. A method according to claim 17, wherein one of said two masking layers is defined partly by an area of the corresponding resist layer exposed directly to the relevant patterned radiation beam and partly by surrounding areas of said corresponding resist layer exposed to scattered radiation from said patterned radiation beam.

19. A method according to claim 18, where said insulating layer is an oxide.

20. A method according to claim 17, where said insulating layer is an oxide.

21. A method according to claim 16, where one of said two masking layers is defined partly by an area of the corresponding resist layer exposed directly to the relevant patterned radiation beam and partly by surrounding areas of said corresponding resist layer exposed to scattered radiation from said patterned radiation beam.

22. A method according to claim 21, where said first and second resist layers are both negative acting or both positive acting, and wherein said insulating layer pattern is formed by oxidizing areas of said semiconductor body free of said insulating layer, said oxide layer pattern being inset into said semiconductor body at least over a part of the thickness of said oxide layer pattern.

23. A method according to claim 22, where said insulating layer is silicon nitride.

24. A method according to one of claims 16, 17, 18, 19, 20, 21, 22 or 23, wherein said parts of said insulating layer free of said first masking layer are removed by etching.

25. A method according to one of claims 16, 17, 18, 19, 20, 21, 22 or 23, wherein said doped region is formed by ion implantation.

26. A method according to claim 25, wherein said ions are implanted into said semiconductor body through said insulating layer.

27. A method according to one of the claims 16, 17, 18, 19, 20, 21, 22, or 23, wherein a field effect transistor is formed in said semiconductor body.

28. A method according to claim 27, wherein said insulating layer pattern is an oxide forming a thick field oxide around said field effect transistor, and wherein said doped region forms a parasitic channel stopper to prevent inversion layers forming below areas of said thick field oxide.

29. A method according to claim 27, wherein said first and second resist layers are sensitive to electron radiation, and said patterned radiation beam is an electron beam.

30. A method according to one of claims 16, 17, 18, 19, 20, 21, 22 or 23, wherein said first and second resist layers are sensitive to electron radiation, and said patterned radiation beam is an electron beam.

* * * * *